(12) United States Patent
Pyczak (10) Patent No.: US 7,828,601 B2
(45) Date of Patent: Nov. 9, 2010

(54) DATA TRANSMISSION CONNECTOR SYSTEM WITH FREE FLOATING POTENTIAL RING

(75) Inventor: Andreas Pyczak, Hilzingen (DE)

(73) Assignee: MC Technology GmbH, Blumberg (DE)

( * ) Notice: Subject to any disclaimer, the term of this patent is extended or adjusted under 35 U.S.C. 154(b) by 0 days.

(21) Appl. No.: 12/457,144

(22) Filed: Jun. 2, 2009

(65) Prior Publication Data

US 2009/0298344 A1    Dec. 3, 2009

(30) Foreign Application Priority Data

Jun. 3, 2008    (DE)    ........................ 10 2008 026 467

(51) Int. Cl.
*H01R 24/00*    (2006.01)
(52) U.S. Cl. ...................................... 439/629
(58) Field of Classification Search ................ 439/629, 439/79, 676, 941
See application file for complete search history.

(56) References Cited

U.S. PATENT DOCUMENTS

| | | | |
|---|---|---|---|
| 6,231,397 B1* | 5/2001 | de la Borbolla et al. | ..... 439/676 |
| 2003/0119372 A1* | 6/2003 | Aekins | ....................... 439/676 |
| 2007/0015416 A1* | 1/2007 | Gutierrez et al. | ............ 439/676 |

* cited by examiner

*Primary Examiner*—Javaid Nasri
(74) *Attorney, Agent, or Firm*—The Nath Law Group; Jerald L. Meyer; Brooks Gifford, III (57) ABSTRACT

The invention relates to a connector system for the transmission of high-frequency signals, in particular on twisted-pair lines, wherein the connector system has a socket for accommodating a plug, a terminal for the connection of an at least two-conductor cable and a printed circuit board with at least two electric signal conductors for connecting the socket to the terminal, wherein at least one conductor path section with free floating potential is provided in the area of the printed circuit board, which section is coupled capacitively and/or inductively to at least two different signal conductors.

10 Claims, 7 Drawing Sheets

Prior Art

Fig. 6

DATA TRANSMISSION CONNECTOR SYSTEM WITH FREE FLOATING POTENTIAL RING

FIELD

The invention relates to a data transmission connector system with free floating potential ring.

BACKGROUND

In signal transmission by means of multipole connectors in general and by means of connectors for data transmission in particular, for example, with connectors that meet the RJ45 standard, there is the problem that crosstalk of signals between the individual signal leads can occur because of capacitive and inductive coupling. Both types of coupling are based on the effect that an alternating voltage applied to a conductor leads to electric (capacitive coupling) or magnetic (inductive coupling) stray fields in the area of the conductor, which in particular in a spatially closely adjacent second conductor lead to the occurrence of an alternating voltage which can be misinterpreted as a signal on this conductor.

In general, capacitive and inductive coupling become stronger when the signal transmission occurs at higher frequencies. The inductive coupling is thereby particularly promoted by the parallel routing of conductor paths, while the capacitive coupling preferably occurs with the occurrence of areas of the conductor paths arranged parallel to one another.

Since with signal transmission and in particular inside connectors transmission signals and received signals are often transmitted in adjacent pairs of wires, with interference signals produced by crosstalk, an undesirable and—for a number of applications—unacceptable distortion in particular of the received signal occurs.

In order to characterize and to quantify this effect for a given connector, the value near-end cross-talk or near-end cross-talk attenuation (NEXT) is used. Near-end cross-talk is defined as the ratio of the level of the useful signal to the level of the interspersed signal of the interference, measured at the same end of the cable, given in decibels (dB). This variable, sometimes also called transverse attenuation, is a gauge of the suppression of the cross-talk between two adjacent pairs of wires. The stronger the cross talk is suppressed, the better the near-end cross-talk.

There are a number of known measures against the occurrence of crosstalk and thus for the improvement of near-end cross-talk. Probably the most elementary of these measures lies in the attempt to effectively prevent the coupling-in of interference signals. This approach is pursued, for example, with the use of twisted pair lines in which the wires of individual pairs of wires are twisted to one another and different pairs of wires with different lengths of twist are twisted with one another. This arrangement makes the coupling-in of interfering signals through inductive couplings much more difficult.

It is likewise known to provide a negative feedback in a targeted manner with which the level of the interference signal caused by crosstalk can be efficiently reduced. With this approach a capacitive or inductive coupling is deliberately produced. A capacitive coupling is realized thereby in that e.g., conductor paths between which the capacitive coupling is to be produced are provided with surfaces that are arranged parallel to one another in different layers. The inductive coupling between two conductor paths is produced in that the respective paths are guided at a small spatial distance running parallel to one another over a distance in a targeted manner.

SUMMARY

The object of the invention is to provide a connector system for signal transmission with improved near-end cross-talk at high transmission frequencies. This object is attained according to the invention by a data transmission connector system with free floating potential ring. Advantageous embodiments and further developments of the invention are given in the subordinate claims.

The connector system according to the invention for the transmission of high-frequency signals, in particular on twisted-pair lines, has a socket for accommodating a plug, a terminal for the connection of an at least two-conductor cable and a printed circuit board with at least two electric signal conductors for connecting the socket to the terminal, which can be embodied, for example, as conductor paths on the printed circuit board. The connector system according to the invention is thereby characterized in that at least one conductor path section with free floating potential is provided in the area of the printed circuit board, which section is coupled capacitively and/or inductively to at least two different signal conductors.

The condition that the potential is free floating thereby means that there is no conductive connection to a potential applied in a defined manner, such as would be represented, for example, by mass or the connection to a signal conductor on which a time-dependent voltage is modulated.

In order that a capacitive coupling can be produced between conductor path sections or signal leads, it is sufficient to provide coupling surfaces arranged at a small spacing and essentially parallel to one another. In addition, with the suitable guidance of conductor path sections of signal conductors, one or more inductive couplings can also be produced. Of course the capacitive coupling to a signal conductor can also be carried out via a conductor path section that is not necessary for the direct connection between the starting point and end point of the signal conductor, as long as this conductor path section is only in ohmic contact with the actual signal conductor connecting these points.

The advantage of the provision according to the invention of a free floating conductor path section that is coupled at least via a capacitive coupling to different signal leads lies in that an improved adjustment between the signal leads thus connected is ensured in a simple and cost-effective manner, which has a positive effect on the crosstalk in particular with high signal transmission frequencies.

In a particularly advantageous embodiment, at least one of the conductor path sections with free floating potential is embodied as a potential ring that surrounds some or all of the signal conductors. Through this embodiment a particularly efficient adjustment and thus further improved crosstalk behavior can be ensured.

The invention is particularly suitable for the use according to the R345 standard. To this end it is advantageous to provide an RJ45 socket. It has proven to be particularly effective with respect to the desired crosstalk behavior particularly with this standard when the or one of the conductor path sections with free floating potential is connected capacitively to three signal conductors, in particular the signal conductors of signals 3, 5 and 6 according to the standard configuration of the RJ45 socket. The high-frequency behavior can be further optimized in that the capacitive coupling to the signal conductor of signal 3 is provided with the terminal, and the capacitive couplings to the signal conductor of signal 5 and to the signal conductor of signal 6 are provided with the socket.

The crosstalk can be further improved in an embodiment in which the at least one of the conductor path sections with free floating potential has a capacitive as well as an inductive coupling to the same signal conductors.

An embodiment of the connector system in which the terminal is embodied as a cut-and-clamp terminal can be used in a particularly practical manner.

BRIEF DESCRIPTION OF THE DRAWINGS

Exemplary embodiments of the invention are explained in detail based on the following figures. They show:

FIG. 1 The known fundamental structure of a connector system for data transmission, FIG. 2 A basic circuit diagram for a connector system with a circuit arrangement according to the prior art, FIG. 3 A basic circuit diagram of an exemplary embodiment for a connector system with a circuit arrangement according to the invention, FIG. 4 A view of the two lowermost conductor path planes of a printed circuit board that can be used in a connector system according to the invention, FIG. 4a An overview of the four conductor path planes of an embodiment of a printed circuit board that can be used in a connector system according to the invention, FIG. 5 A comparative measurement of the near-end crosstalk according to the prior art and according to the exemplary embodiment of the invention shown in FIGS. 3 and 4 and the limit value according to the NEXT standard according to category 6a for an RJ45 component with configuration 36/45, and FIG. 6 A basic circuit diagram of an alternative embodiment of the invention.

DETAILED DESCRIPTION

Figure 1:
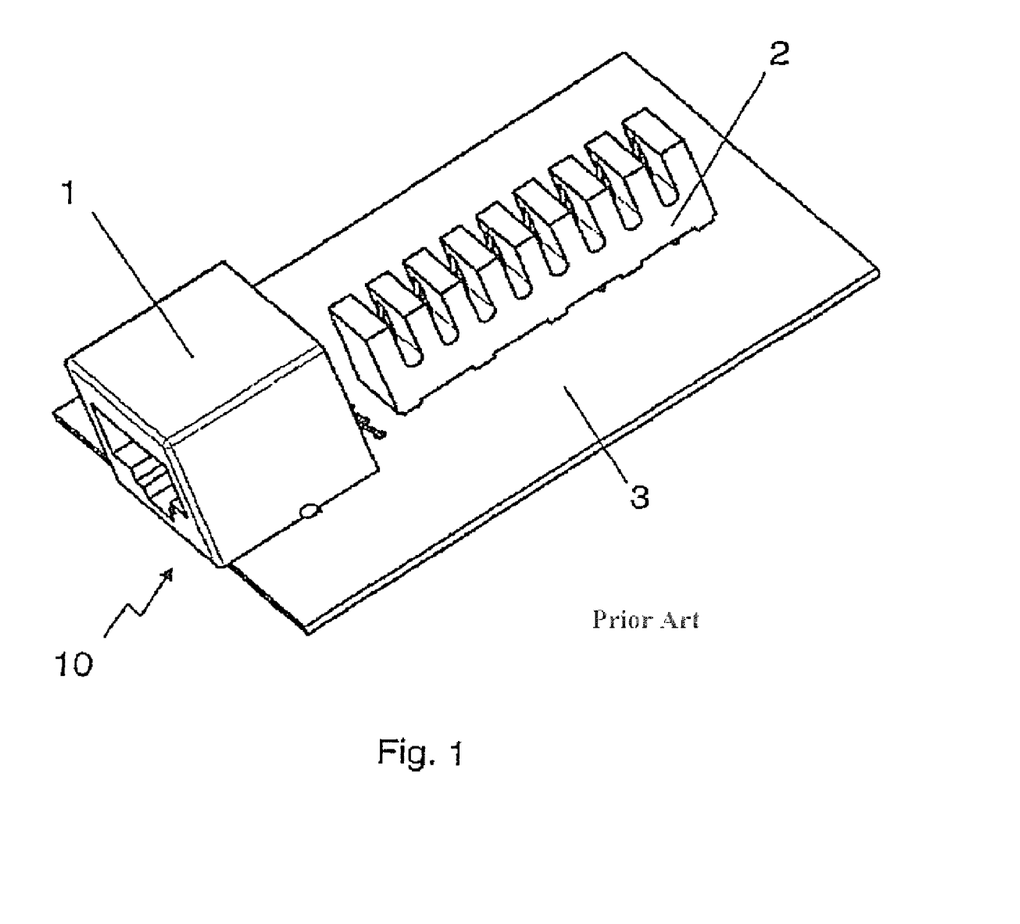

FIG. 1 shows the known mechanical structure of a connector system 10 for data transmission, which system as a rule is a component of an electric device (not shown). The connector system 10 has a socket 1, a terminal 2 and a printed circuit board 3. A signal connection cable (not shown) that combines several signal conductors can be inserted into the socket 1, which signal connection cable serves to relay signals transmitted through the device or to feed signals to be received by the device. Signal conductors can be connected to the terminal 2, which preferably has cut-and-clamp terminal contacts, which signal conductors feed the signals inside the device to the corresponding components. An influence on the crosstalk is carried out by the guidance of conductor paths embodied on the printed circuit board 3; this desired influence would not be possible in the case of a direct arrangement of the terminal 2 on the socket 1.

Figure 2:
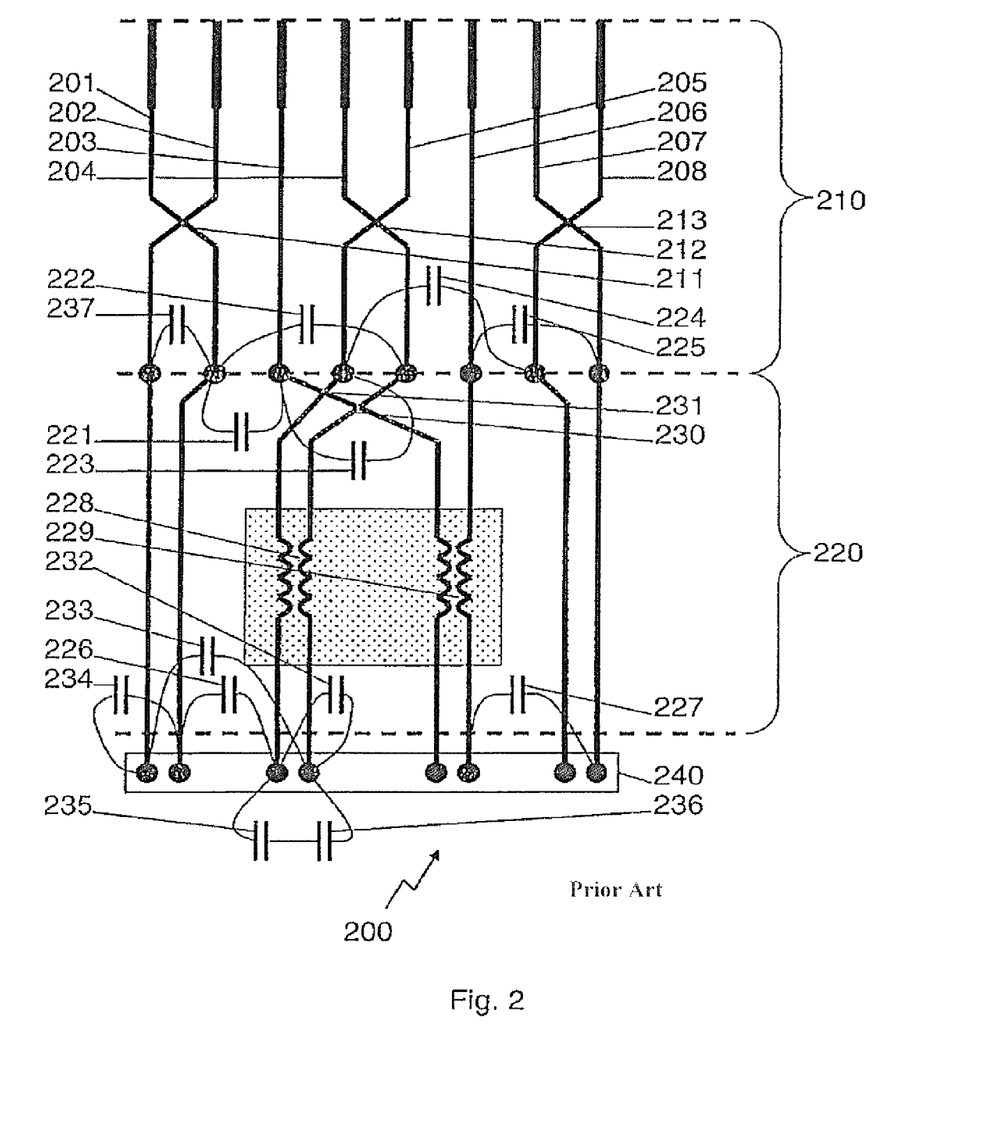

FIG. 2 shows a basic circuit diagram for a connector system 200 with a circuit arrangement according to the prior art. In FIG. 2 a socket section 210, a printed circuit board section 220 and a terminal 240 are discernible, through which respectively 8 signal conductors 201, 202, 203, 204, 205. 206, 207, 208 are guided. In the area of the terminal 240 from left to right the signal conductors 202 and 201, 205 and 204, 203 and 206 and 208 and 207 are thereby combined to form pairs. Through a crossover point 230 of the signal conductors 203 and 204 arranged in the printed circuit board section 220 as well as a further crossover point 231 of the signal conductors 203 and 205 arranged in the printed circuit board section 220 it is ensured in connection with further crossover points 211 arranged in the socket section 210 between signal conductors 202 and 201, 212 between signal conductors 205 and 204 and 213 between signal conductors 208 and 207 that at the contact areas of the signal conductors 201, 202, 203, 204, 205, 206, 207 and 208 shown in bold in FIG. 2 in the socket section 210 the arrangement of the contact areas is adapted to the pin configuration of the signal cable.

In order to improve the near-end cross-talk of this connector system 200, in addition inductive couplings 228 and 229 are provided in the printed circuit board section between the signal conductors 205 and 204 as well as between the signal conductors 203 and 206, which inductive couplings are shown diagrammatically as coils, but in the actual embodiment do not necessarily require an embodiment of the corresponding signal conductor as a coil.

Furthermore, capacitive couplings 221, 222, 223, 224, 225, 226 and 227 are provided, wherein the capacitive coupling 221 occurs between signal conductors 201 and 203, the capacitive coupling 222 between signal conductors 201 and 204, the capacitive coupling 223 between signal conductors 203 and 205, the capacitive coupling 224 between Signal conductors 205 and 208, the capacitive coupling 225 between signal conductors 206 and 207, the capacitive coupling 226 between signal conductors 201 and 205 and the capacitive coupling 227 between signal conductors 206 and 207.

Also in the case of the capacitive couplings 221, 222, 223, 224, 225, 226 and 227, the representation of the capacitive coupling as a capacitor is to be interpreted diagrammatically; in the actual embodiment it can be sufficient, e.g., to provide corresponding coupling surfaces on the conductor paths forming the signal conductors 201, 202, 203, 204, 205, 206, 207 and 208.

Further capacitive couplings 232-237 are likewise discernible, which, however, are already known from the prior art.

Figure 3:
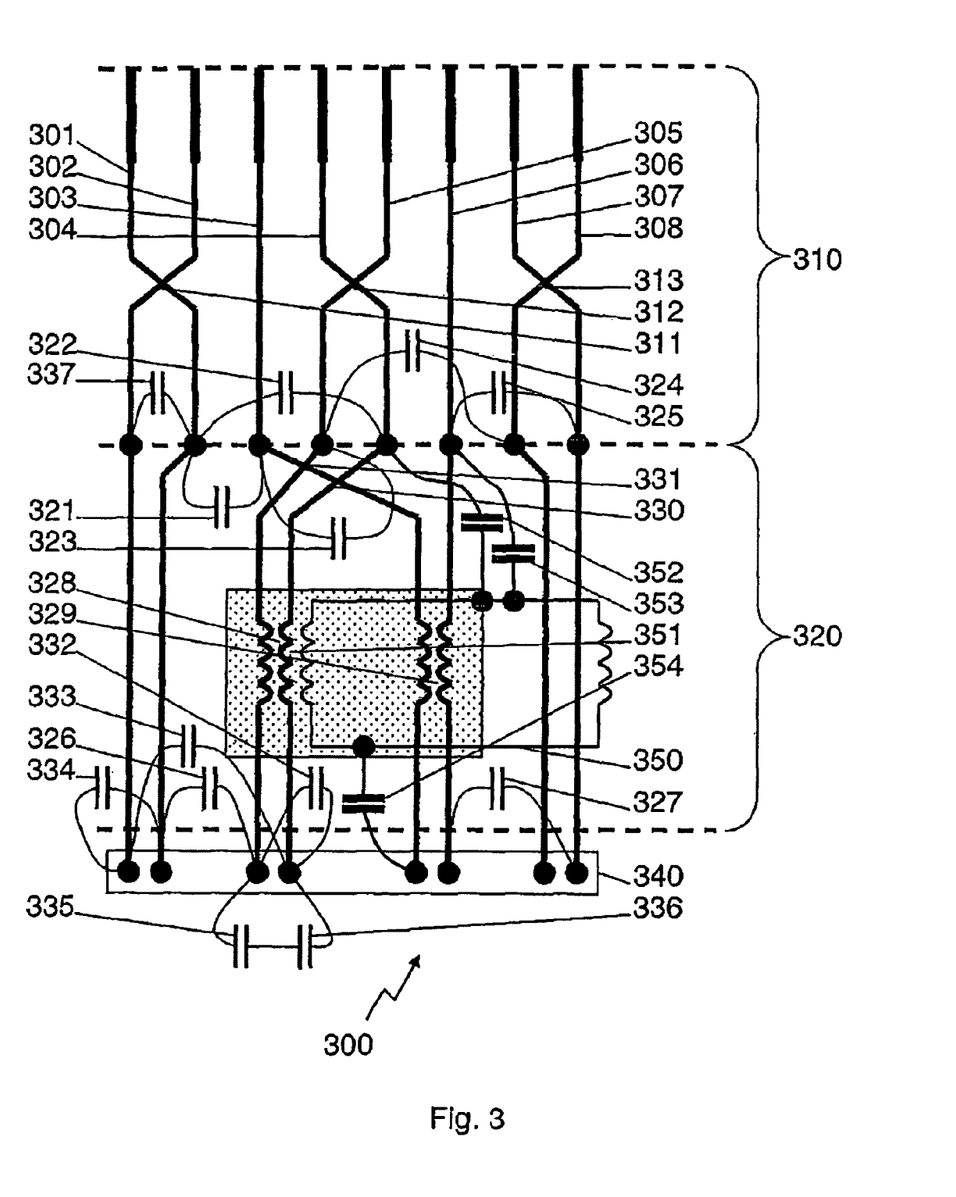

FIG. 3 shows a basic circuit diagram of an exemplary embodiment for a connector system with a circuit arrangement 300 according to the invention, which represents an expansion of the circuit arrangement 200 known from the prior art and described above. In FIG. 3 a socket section 310, a printed circuit board section 320 and a terminal 340 are discernible, through which respectively 8 signal conductors 301, 302, 303, 304, 305, 306, 307, 308 are guided. In the area of the terminal 340 from left to right the signal conductors 302 and 301, 305 and 304, 303 and 306 as well as 308 and 307 are thereby combined to form pairs. Through a crossover point 330 of the signal conductors 303 and 304 arranged in the printed circuit board section 320 as well as a further crossover point 331 of signal conductors 303 and 305 arranged in the printed circuit board section 320, it is ensured in connection with further crossover points 311 arranged in the socket section 310 between signal conductors 302 and 301, 312 between signal conductors 305 and 304 as well as 313 between signal conductors 308 and 307 that at the contact areas represented in bold type in FIG. 3 of signal conductors 301, 302, 303, 304, 305, 306, 307 and 308 the arrangement of the contact areas is adapted to the pin configuration of the signal cable.

In order to improve the near-end cross-talk of this connector system 300, in addition inductive couplings 328 and 329 are provided in the printed circuit board section between the signal conductors 305 and 304 as well as between the signal conductors 303 and 306, which inductive couplings are represented diagrammatically as coils, but in the actual embodiment do not necessarily require an embodiment of the corresponding signal conductors as coils.

Furthermore, capacitive couplings 321, 322, 323, 324, 325, 326 and 327 are provided, wherein the capacitive coupling 321 occurs between signal conductors 301 and 303, the capacitive coupling 322 between signal conductors 301 and 304, the capacitive coupling 323 between signal conductors 303 and 305, the capacitive coupling 324 between signal conductors 305 and 308, the capacitive coupling 325 between signal conductors 306 and 307, the capacitive coupling 326 between signal conductors 301 and 305 and the capacitive coupling 327 between signal conductors 306 and 307.

The representation of the capacitive coupling as a capacitor is also to be interpreted diagrammatically in the case of the capacitive couplings 321, 322, 323, 324, 325, 326 and 327; in the actual embodiment it can be sufficient, e.g., to provide corresponding coupling surfaces on the conductor paths forming the signal conductors 301, 302, 303, 304, 305, 306, 307 and 308.

Capacitive couplings 332-337 are likewise discernible, which, however, are already known from the prior art.

In addition to these measures known from the prior art for improving the near-end cross-talk, according to the invention a further conductor path section, here in the form of a potential ring 350, is provided, which is not in ohmic contact with a contact element of the socket section 310 or with a contact element of the terminal 340.

Furthermore, there is an additional inductive coupling 351 between the potential ring 350 and the signal conductor 304 as well as additional capacitive couplings 352 between the potential ring 350 and the signal conductor 304, 353 between the potential ring 350 and the signal conductor 306 and 354 between the potential ring 350 and the signal conductor 303. Consequently, the signal coupled by the potential ring 350 into the signal conductors 303, 304 and 306 respectively coupled thereto is based on a superimposition of the signals coupled in the potential ring 350, which leads to a "blurring" or a leveling of the coupling signals and reduces the undesirable modulation of a signal. The area of the potential ring 350 outside the inductive coupling serves essentially the connection of the individual capacitive couplings. If necessary, other configurations can also be connected via a capacitor or capacitively to the potential ring 350.

Figure 4:
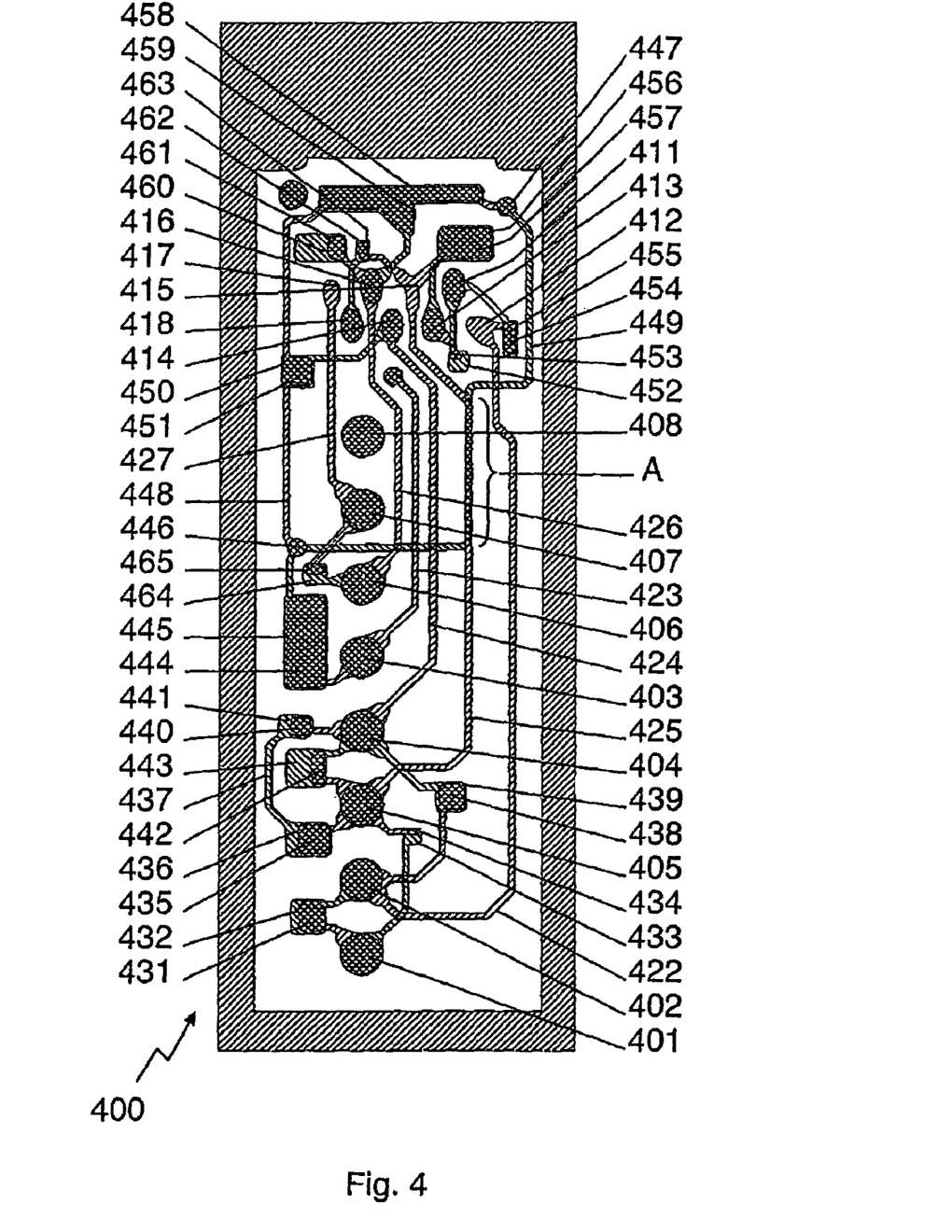
Figure 4A:
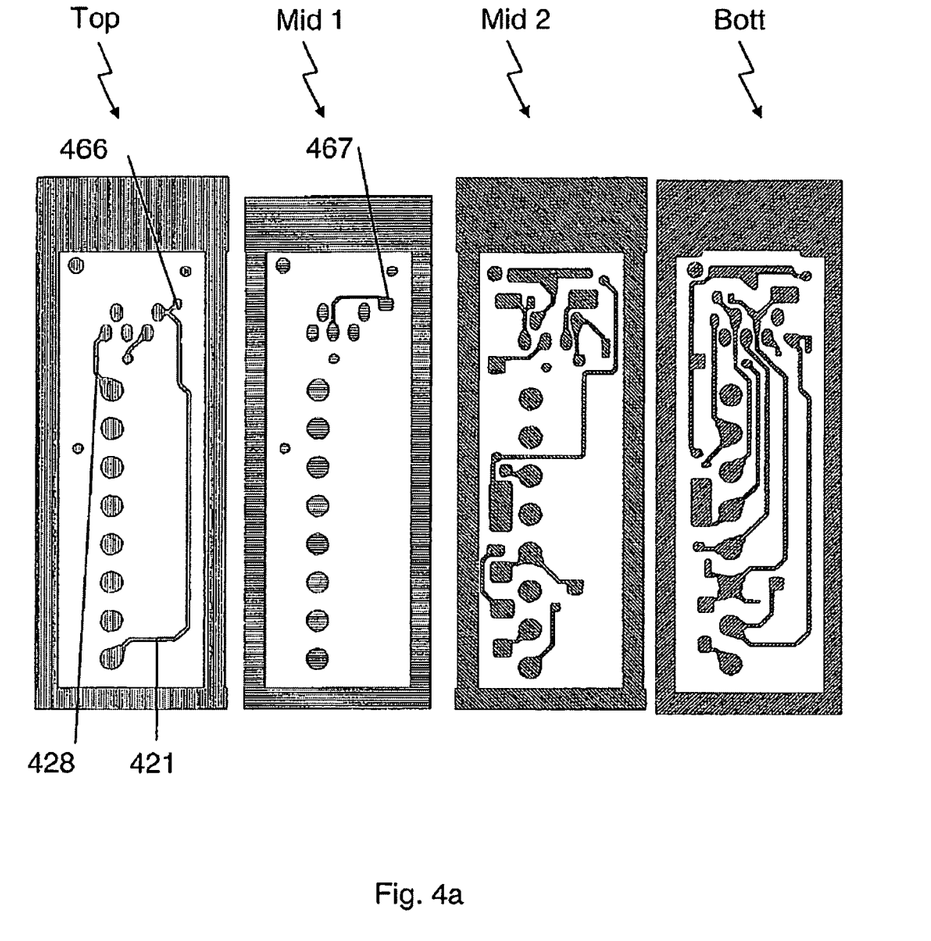

FIG. 4 shows a view of the two lower conductor path planes of a printed circuit board 400, as can be used in a connector system according to the invention. In total, the printed circuit board 400 comprises four conductor path planes which are arranged one above the other. The layout of conductor path planes Top, Mid1, Mid2 and Bott is shown in FIG. 4a; the order of the arrangement of the planes of conductor paths in the printed circuit board 400 from top to bottom is Top, Mid1, Mid2 and Bott. With the exception of a coupling between a coupling surface 466 arranged in the conductor path plane Top and a coupling surface 467 arranged in the conductor path plane Mid1, the capacitive couplings produced by the layout occur between the conductor path planes Mid2 and Bott and are described below. Furthermore, signal conductors 421 and 428 are discernible in the conductor path plane Top, the course of which signal conductors is likewise explained more precisely below.

Accordingly, FIG. 4 shows a view of the conductor path planes Mid2 and Bott, which are arranged in two different levels. The layer Mid2 located further up in the line of sight of FIG. 4 is thereby characterized for clarification with a hatching from bottom left to top right, and the layer Bott located further down, with a hatching from top left to bottom right. At places in FIG. 4 at which an overlap occurs between the conductor path planes Mid2 and Bott, the two hatchings overlapping one another respectively produce a cross hatching.

Through the arrangement of the conductor paths in several layers, in particular a capacitive coupling can easily be produced. To this end it is necessary only to provide coupling surfaces arranged one above the other of a size that corresponds to the desired strength of the capacitive coupling at a suitable point of the conductor paths guided one above the other. Accordingly, at points at which a cross hatching occurs in FIG. 4, there is respectively a capacitive coupling.

In FIG. 4 contact points 401, 402, 403, 404, 405, 406, 407 and 408 are discernible, at which an electrical contact to the terminal (not shown) can be produced and contact points 411, 412, 413, 414, 415, 416, 417 and 418, at which an electrical contact to the socket (not shown either) can be produced.

A signal conductor 421 shown in FIG. 4a and belonging to the conductor path plane Top runs between the contact points 401 and 411. a signal conductor 422 runs between the contact points 402 and 412, a signal conductor 423 runs between the contact points 403 and 413. a signal conductor 424 runs between the contact points 404 and 414, a signal conductor 425 runs between the contact points 405 and 415, a signal conductor 426 runs between the contact points 406 and 416. a signal conductor 427 runs between the contact points 407 and 417, and a signal conductor 428 miming in the conductor path plane Top and shown in FIG. 4a runs between the contact points 408 and 418. As a rule, the signal conductors 421, 422, 423, 424, 425, 426, 427, 428 are embodied as conductor paths, however, a different embodiment is also conceivable.

In section A of the printed circuit board 400, the signal conductors 424, 425 and 426 are deliberately guided parallel at a small distance from one another. In this area an inductive coupling between these conductor paths is thereby achieved.

The printed circuit board 400 shown in FIG. 4 also shows a potential ring as it is provided according to a preferred embodiment of the invention. In FIG. 4 the potential ring is composed of two conductor path sections 448 and 449, which run on different planes and are joined to conductor path sections 446, 447, which lead from the one plane into the other plane. A part of the conductor path section 449 is thereby guided such that in section A of the printed circuit board 400 there is likewise a parallel and closely adjacent routing to the signal conductors 424, 425 and 426, so that there is an inductive coupling of the potential ring.

Furthermore, the potential ring has coupling surfaces 445, 451 and 459, via which a capacitive coupling is produced to signal connections. In detail, via the coupling surface 445, the coupling surface 444 and the contact point 403 a capacitive coupling to the signal conductor 423 is produced, via the coupling surface 451, the coupling surface 450 and the contact point 414 a capacitive coupling to the signal conductor 424 is produced and via the coupling surface 459, the coupling surface 458 and the contact point 416 a capacitive coupling to the signal conductor 426 is produced. As already stated above, a capacitive coupling to a signal conductor is already produced when a capacitive coupling to a coupling surface in ohmic contact with a signal conductor occurs.

In addition to the potential ring with free floating potential, the printed circuit board 400 shown in FIG. 4, however, also shows a more general embodiment of the inventive concept in the form of a free floating connector path section 437, which is coupled at least capacitively to at least two different Signal conductors, namely via the coupling surfaces 436 and 435 and the contact point 405 to the signal conductor 425 and via the coupling surfaces 440 and 441 and the contact point 404 to the signal conductor 424.

In addition, a plurality of further conductor paths with coupling surfaces respectively adapted in terms of size to the desired coupling strength are provided on the printed circuit board, through which coupling surfaces targeted capacitive coupling can be produced between the signal conductors 421, 422, 423, 424, 425, 426, 427 and 428. The following are capacitively coupled to one another:

Signal conductor 421 via a coupling surface 431 and a coupling surface 432 to signal conductor 422, Signal conductor 421 via a coupling surface 433 and a coupling surface 434 to signal conductor 425, Signal conductor 422 via a coupling surface 438 and a coupling surface 439 to signal conductor 424, Signal conductor 425 via a coupling surface 442 and a coupling surface 443 to signal conductor 424, Signal conductor 426 via a coupling surface 464 and a coupling surface 465 to signal conductor 427, Signal conductor 421 via a coupling surface 454 and a coupling surface 455 to signal conductor 422, Signal conductor 421 via a coupling surface 453 and a coupling surface 452 to signal conductor 423, Signal conductor 423 via a coupling surface 456 and a coupling, surface 457 to signal conductor 425, Signal conductor 425 via a coupling surface 462 and a coupling surface 463 to signal conductor 428, Signal conductor 426 via a coupling surface 460 and a coupling surface 461 to signal conductor 428.

The respective coupling surfaces are thereby as a rule not a component of the actual signal conductors, but connected thereto in an electrically conducting manner.

Figure 5:
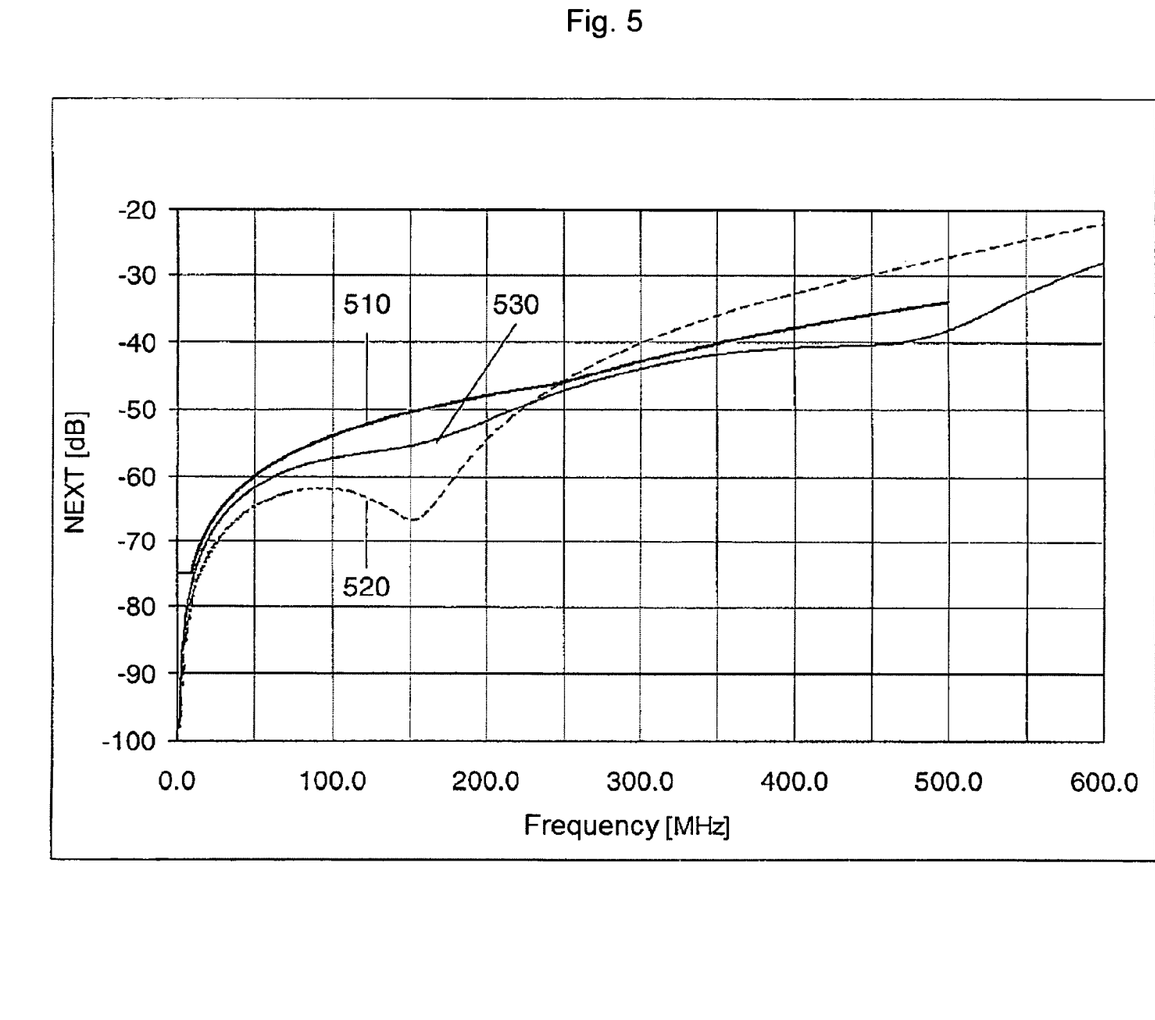

FIG. 5 shows a comparative measurement of the near-end cross-talk of circuit arrangements according to the prior art and according to the invention as well as the limit value according to the NEXT standard according to category 6a for an RJ45 component with configuration 36/45. The crosstalk is plotted in decibels against the frequency of the signal in megahertz. FIG. 5 shows a continuous curve 510, a dotted curve 520 and a dashed curve 530.

The continuous curve 510 gives the standard stipulated for signal connections of category 6a. The value on this curve represents the highest acceptable value of the crosstalk at a given operating frequency, it must not be exceeded by a signal conductor meeting the standard; the lower it falls below this level, the more crosstalk is attenuated, which leads to a better signal conductor.

The dotted curve 520 describes the measured frequency-dependency of the near-end crosstalk of a circuit arrangement according to the prior art. It is directly discernible that above a frequency of approx. 250 MHz this circuit arrangement no longer meets the category 6a standard for crosstalk, but exceeds it.

The dashed curve 530 describes the measured frequency-dependency of the near-end crosstalk for a circuit arrangement according to the invention. It is directly discernible that this curve clearly more than meets this standard over the entire frequency range for which the standard is defined, whereby the excellent suitability of the circuit arrangement according to the invention for high-frequency signal transmission is clearly proven.

Figure 6:
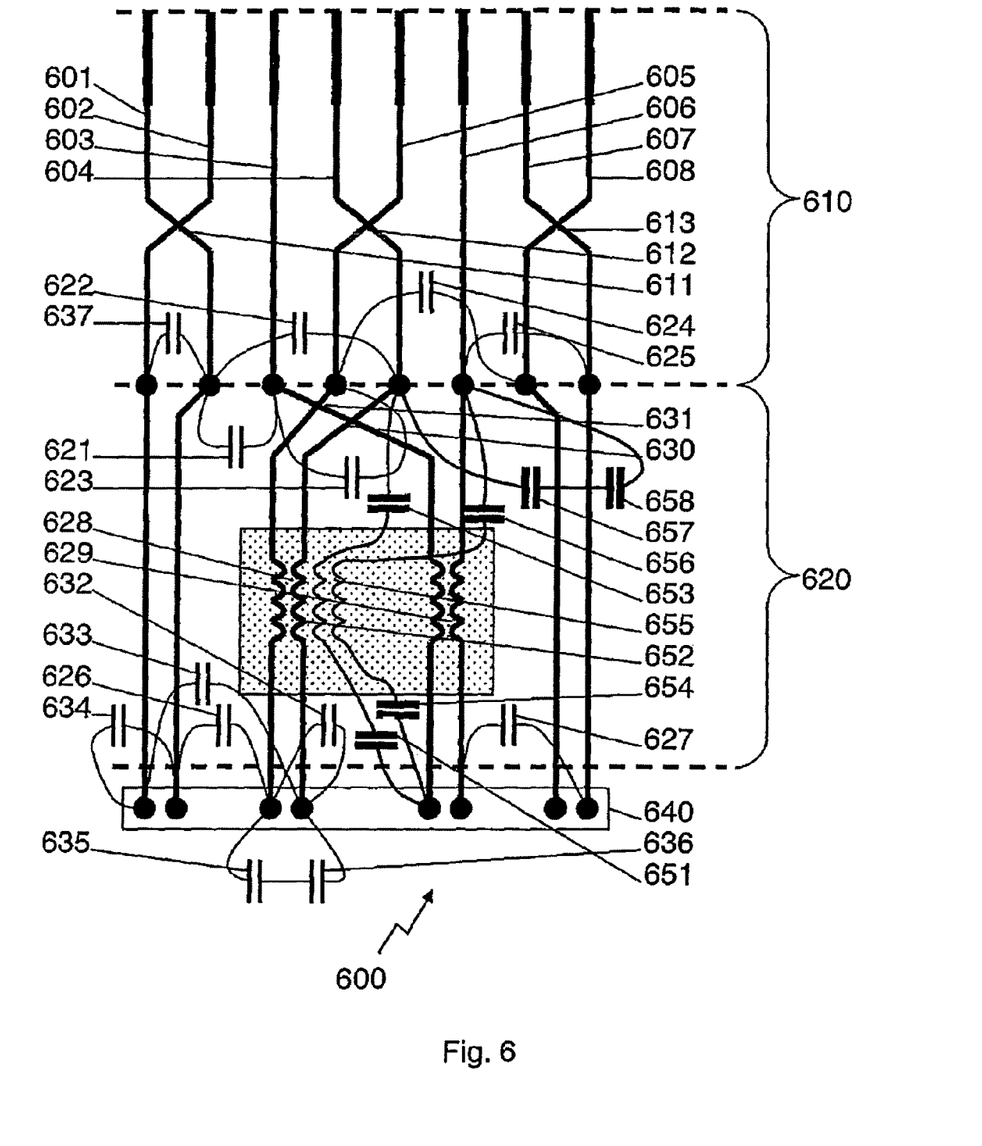

FIG. 6 shows a basic circuit diagram of a second exemplary embodiment for a connector system with a circuit arrangement 600 according to the invention, which circuit arrangement represents an expansion of the circuit arrangement known from the prior art and described in detail in connection with FIG. 2. In FIG. 6 a socket section 610, a printed circuit board section 620 and a terminal 640 are discernible, through which respectively 8 signal conductors 601, 602, 603, 604, 605, 606, 607, 608 are guided. In the area of the terminal 640 from left to right the signal conductors 602 and 601, 605 and 604, 603 and 606 as well as 608 and 607 are thereby combined to form pairs. Through a crossover point 630 of the signal conductors 603 and 604 arranged in the circuit board section 630 as well as a further crossover point 631 of the signal conductors 603 and 605 arranged in the circuit board section 620, it is ensured in connection with further crossover points 611 arranged in the socket section 610 between signal conductors 602 and 601,612 between signal conductors 605 and 604 as well as 613 between signal conductors 608 and 607 that at the contact areas shown in bold in FIG. 6 of the signal conductors 601, 602, 603, 604, 605, 606, 607 and 608 the arrangement of the contact areas is adapted to the pin configuration of the signal cable.

In order to improve the near-end cross-talk of this connector system 600, in addition inductive couplings 628 or 629 are provided in the printed circuit board section between the signal conductors 605 and 604 as well as between the signal conductors 603 and 606, which inductive couplings are shown diagrammatically as coils, but in the actual embodiment do not necessarily require an embodiment of the corresponding signal conductors as coils.

Furthermore, capacitive couplings 621, 622, 623, 624, 625, 626 and 627 are provided, wherein the capacitive coupling 621 occurs between the signal conductors 601 and 603, the capacitive coupling 622 between the signal conductors 601 and 604, the capacitive coupling 623 between signal conductors 603 and 60S, the capacitive coupling 624 between signal conductors 605 and 608, the capacitive coupling 625 between signal conductors 606 and 607, the capacitive coupling 626 between signal conductors 601 and 605 and the capacitive coupling 627 between signal conductors 606 and 607.

Also in the case of the capacitive couplings 621, 622, 623, 624, 625, 626 and 627 the representation of the capacitive coupling as a capacitor is to be interpreted diagrammatically; in the actual embodiment it can be sufficient, e.g., to provide corresponding coupling surfaces on the conductor paths forming the signal conductors 601, 602, 603, 604, 605, 606, 607 and 608.

Further capacitive couplings 632-637 are likewise discernible, which, however, are already known from the prior art.

In addition to these measures known from the prior art for improving the near-end cross-talk, according to the invention further conductor path sections are provided, which respectively are not in ohmic contact with a contact element of the socket section 610 or with a contact element of the terminal 640. In the exemplary embodiment shown in FIG. 6, three such conductor path sections are discernible.

The first conductor path section is coupled by a capacitive coupling 651 to the signal conductor 603 and through an inductive coupling 652 as well as a further capacitive coupling 653 to the signal conductor 604. In a concrete embodiment, this first conductor path section thus has a coupling surface to the signal conductor 603, a section running parallel to the signal conductor 604 and a coupling surface to the signal conductor 604, which are in conductive connection with one another, the potential of which however can float freely, thus is not specified by ohmic contact to a defined specified potential, for example, mass or a voltage source. Through this arrangement a compensation of the signal conductor 603 with the signal conductor 605 is achieved.

The second conductor path section is coupled by a capacitive coupling 654 to the signal conductor 603, by an inductive coupling 655 to the signal conductor 604 and by another capacitive coupling 656 to the signal conductor 606 and improves the adjustment in the pair of wires formed by the signal conductors 603 and 606.

The third conductor path section improves the compensation between the signal conductors 605 and 606 through a series connection of two capacitive couplings 657,658.

LIST OF REFERENCE NUMBERS

1 Socket
2 Terminal

3 Printed circuit board
10 Connector system
200 Connector system
201-208 Signal conductor
210 Socket section
211-213 Crossover point
220 Printed circuit board section
221-227 Capacitive coupling
232-237 Capacitive coupling
228 Inductive coupling
229 Inductive coupling
230 Crossover point
231 Crossover point
240 Terminal
300 Connector system
301-308 Signal conductor
310 Socket section
311-313 Crossover point
320 Printed circuit board section
321-327 Capacative coupling
332-337 Capacative coupling
328 Inductive coupling
329 Inductive coupling
330 Crossover point
331 Crossover point
340 Terminal
350 Potential ring
351 Inductive coupling
352 Capacative coupling
353 Capacative coupling
400 Printed circuit board
401-408 Contact point
411-418 Contact point
421-428 Signal conductor
431-436 Coupling surface
437 Free floating conductor section
438-445 Coupling surface
446 Perpendicular conductor section
447 Perpendicular conductor section
448 Conductor section
449 Conductor section
450-467 Coupling surface
510 Continuous curve
520 Dotted curve
530 Dashed curve
600 Conductor system
601-608 Signal conductor
610 Socket section
611-613 Crossover point
620 Printed circuit board section
621-627 Capacitive coupling
632-637 Capacitive coupling
628 Inductive coupling
629 Inductive coupling
630 Crossover point
631 Crossover point
640 Terminal
651 Capacitive coupling
652 Inductive coupling
653 Capacitive coupling
654 Capacitive coupling
655 Inductive coupling
656-658 Capacitive coupling
Top Conductor path plane
Mid 1 Conductor path plane
Mid2 Conductor path plane
Bott Conductor path plane

The invention claimed is:

1. A connector system for the transmission of high-frequency signals, comprising:
   a socket for accommodating a plug;
   a terminal for connecting an at least two-conductor cable;
   a printed circuit board with at least two electric signal conductors for connecting the socket to the terminal; and
   at least one conductor path section with free floating potential provided in the area of the printed circuit board, wherein the at least one conductor path section is a free floating potential ring inductively or capacitively but not conductively coupled to at least two different signal conductors.

2. The connector system of claim 1, wherein the at least one conductor path section with free floating potential is capacitively coupled to at least one of the two different signal conductors.

3. The connector system of claim 1, wherein the at least one conductor path section with free floating potential is inductively coupled to at least one of the two different signal conductors.

4. The connector system of claim 1, wherein the conductor path section with free floating potential is a potential ring surrounding at least one signal conductor.

5. The connector system of claim 1, wherein the socket is an RJ45 socket.

6. The connector system of claim 1, wherein the conductor path section with free floating potential is capacitively connected to at least three signal conductors.

7. The connector system of claim 6, wherein at least one of the three signal conductors connects to an RJ45 socket.

8. The connector system of claim 6, wherein a first one of the at least three signal conductors capacitively couples to the terminal, and at least one of the two remaining three signal conductors connects to the socket.

9. The connector system of claim 1, wherein the conductor path section with free floating potential is both capacitively and inductively coupled to at least one of the two different signal conductors.

10. The connector system of claim 1, wherein the terminal is a cut-and-clamp terminal.

* * * * *